US007224293B2

(12) United States Patent
Parker (10) Patent No.: US 7,224,293 B2
(45) Date of Patent: May 29, 2007

(54) DATA COMPRESSION SYSTEM AND METHOD

(75) Inventor: Bruce Parker, New South Wales (AU)

(73) Assignee: Pacbyte Software Pty Limited, Epping, New South Wales (AU)

( * ) Notice: Subject to any disclaimer, the term of this patent is extended or adjusted under 35 U.S.C. 154(b) by 31 days.

(21) Appl. No.: 10/539,645

(22) PCT Filed: Oct. 15, 2004

(86) PCT No.: PCT/AU2004/001406

§ 371 (c)(1),
(2), (4) Date: Jun. 15, 2005

(87) PCT Pub. No.: WO2005/039057

PCT Pub. Date: Apr. 28, 2005

(65) Prior Publication Data

US 2006/0244639 A1    Nov. 2, 2006

(30) Foreign Application Priority Data

Oct. 17, 2003   (AU) .............................. 2003905688

(51) Int. Cl.
*H03M 7/34* (2006.01)
(52) U.S. Cl. .......................................... 341/51; 341/50
(58) Field of Classification Search ................ 341/63, 341/50, 51; 382/233, 232; 358/1.16, 1.15
See application file for complete search history.

(56) References Cited

U.S. PATENT DOCUMENTS 6,628,717 B1 * 9/2003 Jeong et al. ........... 375/240.19

6,657,565 B2 * 12/2003 Kampf .......................... 341/51
6,868,186 B1 * 3/2005 Sadeh ........................ 382/238
6,961,927 B1 * 11/2005 Erb et al. .................... 717/130

FOREIGN PATENT DOCUMENTS

JP      2006174487 A   *  7/2006

OTHER PUBLICATIONS

Lempel-Ziv (IEEE Transactions on Information Theory, vol. IT-23, No. 3, May 1977).*

* cited by examiner

*Primary Examiner*—Brian Young
(74) *Attorney, Agent, or Firm*—Woodcock Washburn LLP (57) ABSTRACT

The invention provides a method of compressing a data file comprising a sequence of bytes of a length greater than or equal to a predefined length, the method including the steps of: retrieving the data file from a secondary storage device; storing the data file in direct access memory; calculating the frequency of unique byte values within a sub-sequence of the data file, the sub-sequence having a length not exceeding the predefined length; creating an index for the sub-sequence, the index including a data value representing the calculated frequency of unique byte values within the sub-sequence; and on the sub-sequence having a frequency of unique byte values below a predetermined threshold, applying a data transformation to the sub-sequence to increase the frequency of unique byte values in the sub-sequence and adding to the index a data value representing the data transformation; on the sub-sequence having a frequency of unique byte values above a predefined threshold, adding to the index a data value representing the position of one or more unique values within the sub-sequence; creating an output data file, the data file having a file type identifier, and adding the index to the output data file.

17 Claims, 7 Drawing Sheets

| Sequence Size | Number of Bytes (Bits) | Index bits indicating Sequence Size | Index bits indicating variation if required | Bits indicating Mask applied | Bits required to represent factorial value | Bits indicating order Combination | Total | Saving |
|---|---|---|---|---|---|---|---|---|
| 377 | 256 (2048) | 2 | 7 | 16 | 1684 | 337 | 2046 | 0.10% |
| 377 | 256 (2048) | 2 |   | 16 | 1684 | 337 | 2039 | 0.44% |
| 350 | 256 (2048) | 2 | 7 | 16 | 1684 | 290 | 1999 | 2.39% |
| 350 | 256 (2048) | 2 |   | 16 | 1684 | 290 | 1992 | 2.73% |
| 320 | 256 (2048) | 2 | 7 | 16 | 1684 | 227 | 1936 | 5.47% |
| 320 | 256 (2048) | 2 |   | 16 | 1684 | 227 | 1929 | 5.81% |
| 300 | 256 (2048) | 2 | 7 | 16 | 1684 | 178 | 1886 | 7.91% |
| 300 | 256 (2048) | 2 |   | 16 | 1684 | 178 | 1879 | 8.25% |
| 152 | (892) | 2 |   | 16 | 717 | 93 | 828 | 7.17% |
| 77 | (384) | 2 |   | 16 | 296 | 48 | 362 | 5.73% |

DATA COMPRESSION SYSTEM AND METHOD

FIELD OF INVENTION

The invention relates to the field of data compression and in particular relates to a system and method of data compression based on factorial reiterative lossless compression.

BACKGROUND TO INVENTION

Electronic binary files exist in many different formats for many different uses. These formats include formats suitable for storage of image, sound, text, data, executable files, and so on.

Binary files containing data, if not encrypted, tend towards a structured format. There is usually header information, text, repetition, and positioning amongst other components. Generally the first few bytes in a binary file contain an indicator of a file type and therefore the application with which the binary file is compatible. Executable files or files used to perform functions of any type have a considerably less structured format. There is, however, an element of structure as these files either have to interact with an operating system to perform a function, or they are part of the operating system.

Compressed and encrypted files have the least structure as, by design, they remove repetitive values within a file. In the case of encryption, a key is used to define the substituted values. For compression, a "shorthand" is used for repetitive structures. In the case of an encrypted or compressed file, the file will not only have the internal structure changed but, particularly in the case of compression, the size of the file.

Mathematically for a binary file of size 1,048,576 bytes (1 Mb) there are $256^{1,048,576}$ possible structures of arrangement of bytes possible. In actual usage only a fraction of this number is used. The number actually used can only be approximated based on an estimate of a number of different file types, functionality of executable or operational files, and compression and encryption routines available.

There are many existing techniques to perform data compression on a data file. Some data compression algorithms are based on indexing techniques and involve the calculation and indexing of unique values within a data file. In most compressed data files, there is some repetition of data values within each 256 byte code segment. In average files, there are only 160 to 170 unique non-repeated values per 256 byte segment of code. Data compression techniques based on factorial calculations do not work very well with this number of values.

SUMMARY OF INVENTION

In one aspect the invention provides a method of compressing a data file comprising a sequence of bytes of a length greater than or equal to a predefined length, the method including the steps of: retrieving the data file from a secondary storage device; storing the data file in direct access memory; calculating the frequency of unique byte values within a sub-sequence of the data file, the sub-sequence having a length not exceeding the predefined length; creating an index for the sub-sequence, the index including a data value representing the calculated frequency of unique byte values within the sub-sequence; and on the sub-sequence having a frequency of unique byte values below a predetermined threshold, applying a data transformation to the sub-sequence to increase the frequency of unique byte values in the sub-sequence and adding to the index a data value representing the data transformation; on the sub-sequence having a frequency of unique byte values above a predefined threshold, adding to the index a data value representing the position of one or more unique values within the sub-sequence; creating an output data file, the data file having a file type identifier; and adding the index to the output data file.

BRIEF DESCRIPTION OF THE FIGURES

Preferred forms of the data compression system and method of the invention will now be described with reference to the accompanying figures in which.

DETAILED DESCRIPTION OF PREFERRED FORMS

Figure 1:
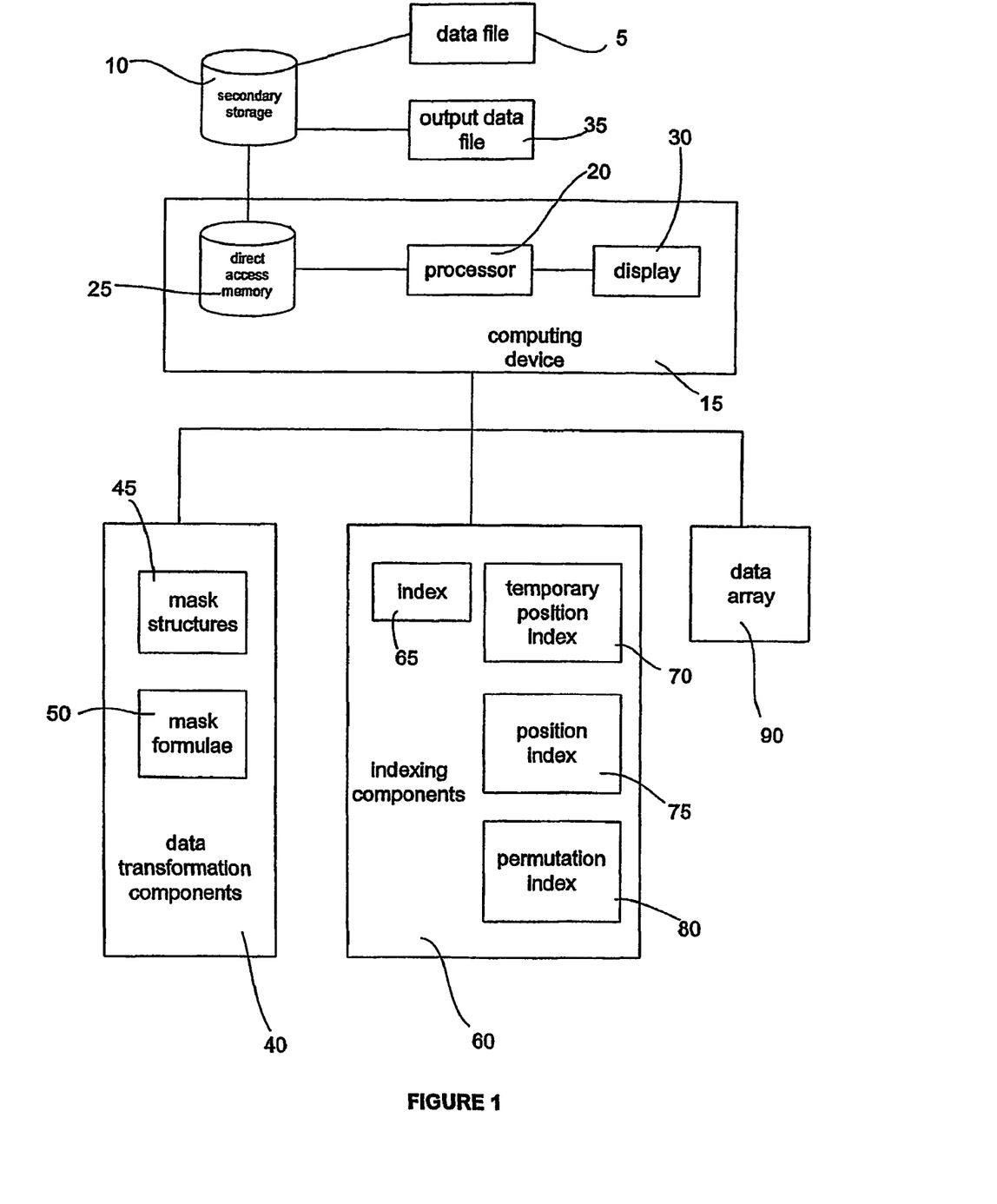
FIG. 1 shows a preferred form of the system of the invention.

The invention provides a data compression system and method that is intended to apply to a data file 5. The data file 5 could be of any suitable data format including BMP, WAV, DOC, XLS, MDB, ZIP, SIT, ARJ, ZOO, TIF, JPG, GIF, MP3, MP4 and so on. Data file 5 could be stored in secondary storage 10 forming part of or at least interfaced with a computing device 15. Computing device 15 includes at least processor 20 interfaced to direct access memory 25 and a display 30. It will be appreciated that the computing device could include or be interfaced to other components for example a data entry device (not shown) and an output device (not shown).

It is anticipated that the data file 5 comprise a sequence of bytes of a length greater than or equal to a predefined length In one preferred form of the invention this predefined length is 300 bytes.

In operation the processor 20 of the computing device 15 retrieves all or part of the data file 5 from secondary storage 10. The retrieved data file or part is stored in direct access memory 25. Various operations are conducted on the data file or part thereof stored in. A resulting output data file 35 is created in direct access memory 25 and stored in secondary storage 10 or other secondary storage. It is expected that in many cases the output data file 35 will be of a smaller size than data file 5.

A sub-sequence of the data file 5 is first examined. The length of the sub-sequence preferably does not exceed the predefined length of 300 bytes. If the number of unique values identified falls below a threshold then a series of data transformations can be applied to the sub-sequence in an attempt to increase the frequency of unique byte values in the sub-sequence.

A plurality of data transformation components 40 are stored in either direct access memory 25 or secondary storage. The data transformation components 40 could include a plurality of randomly generated sequences of byte values or predefined sequences of byte values. The sequences are stored as mask structures 45. As an alternative or preferably in addition the data transformation components also include a plurality of mask formulae 50 that can be used to generate additional mask structures 45. Application of the data transformation components are further described below.

The system also includes a plurality of indexing components 60. During processing of the sub-sequence of the data file 5, an index 65 is created that is subsequently written to output data file 35. The indexing components 60 could also include a temporary position index 70, a position index 75 and a permutation index 80. The contents of the position index 75 and permutation index 80 in some cases will be added to the index 65. Operation of the various indexing components 60 will be further described below.

The system may also include a data array 90 stored in direct access memory 25 or secondary storage. The data array 90 could be used to store the various indexing components 60 and portions of the sub-sequence of data file 5 being compressed, before the contents of the data array 90 are written to the output data file 35.

Figure 2:
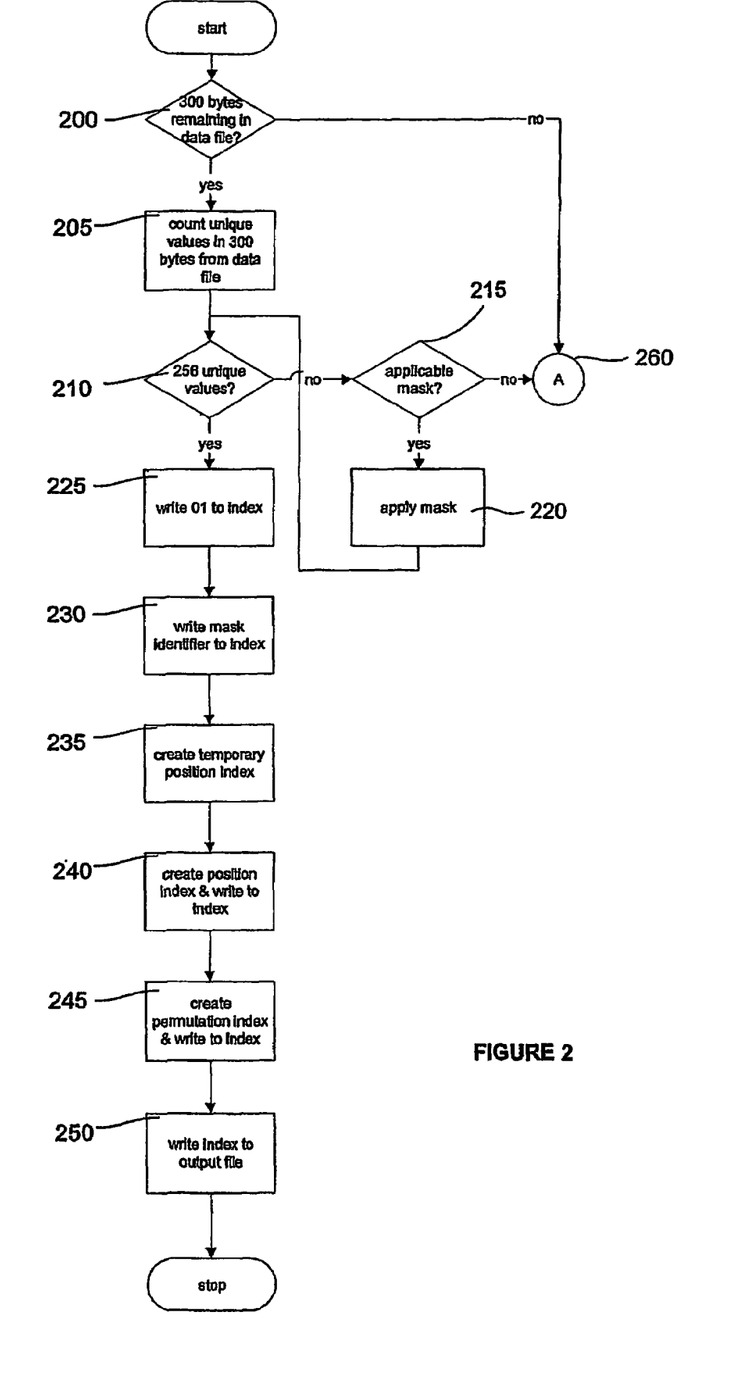
FIGS. 2, 3 and 4 show flow charts of a preferred form compression process of the invention.
Figure 3:
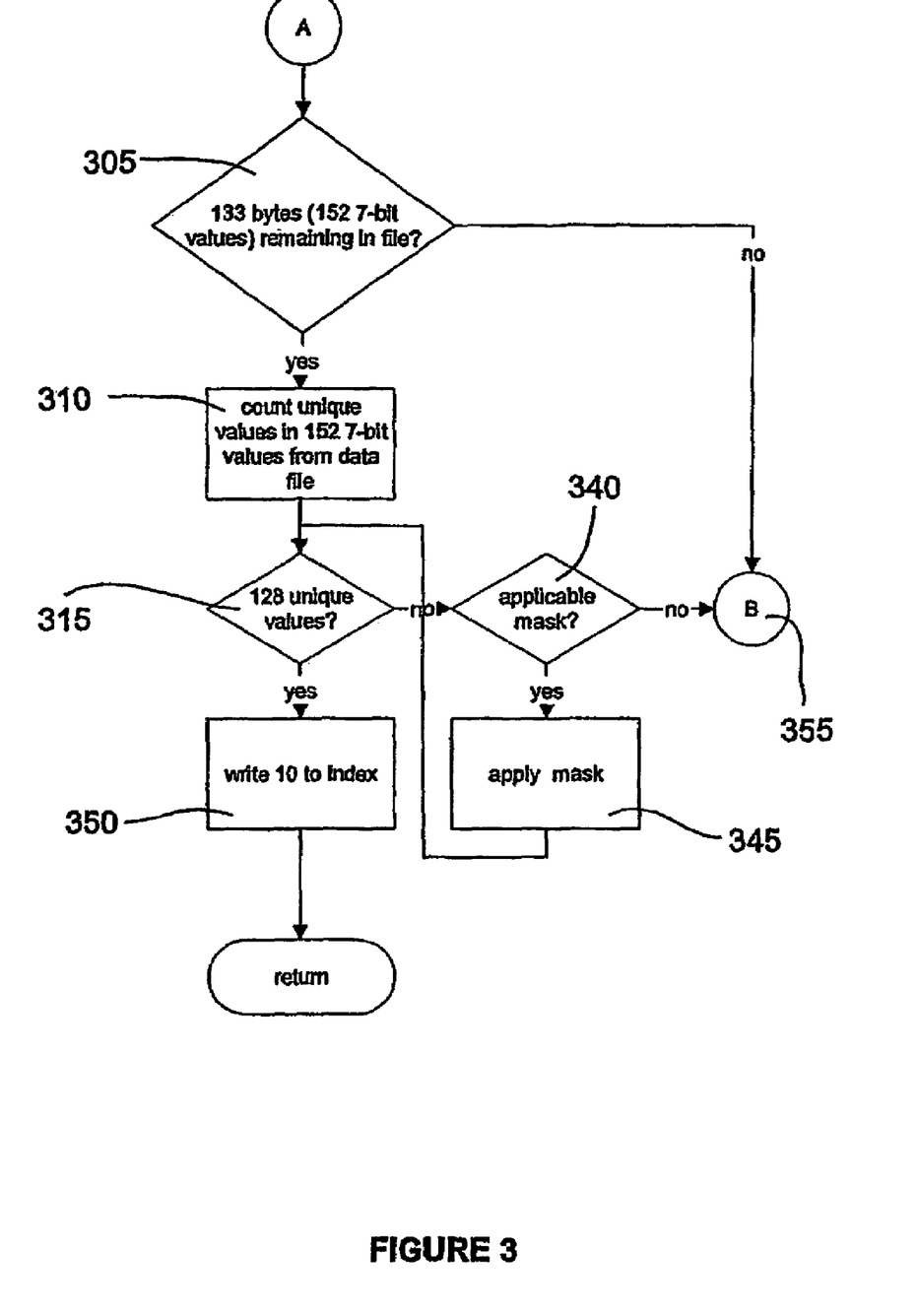
Figure 4:
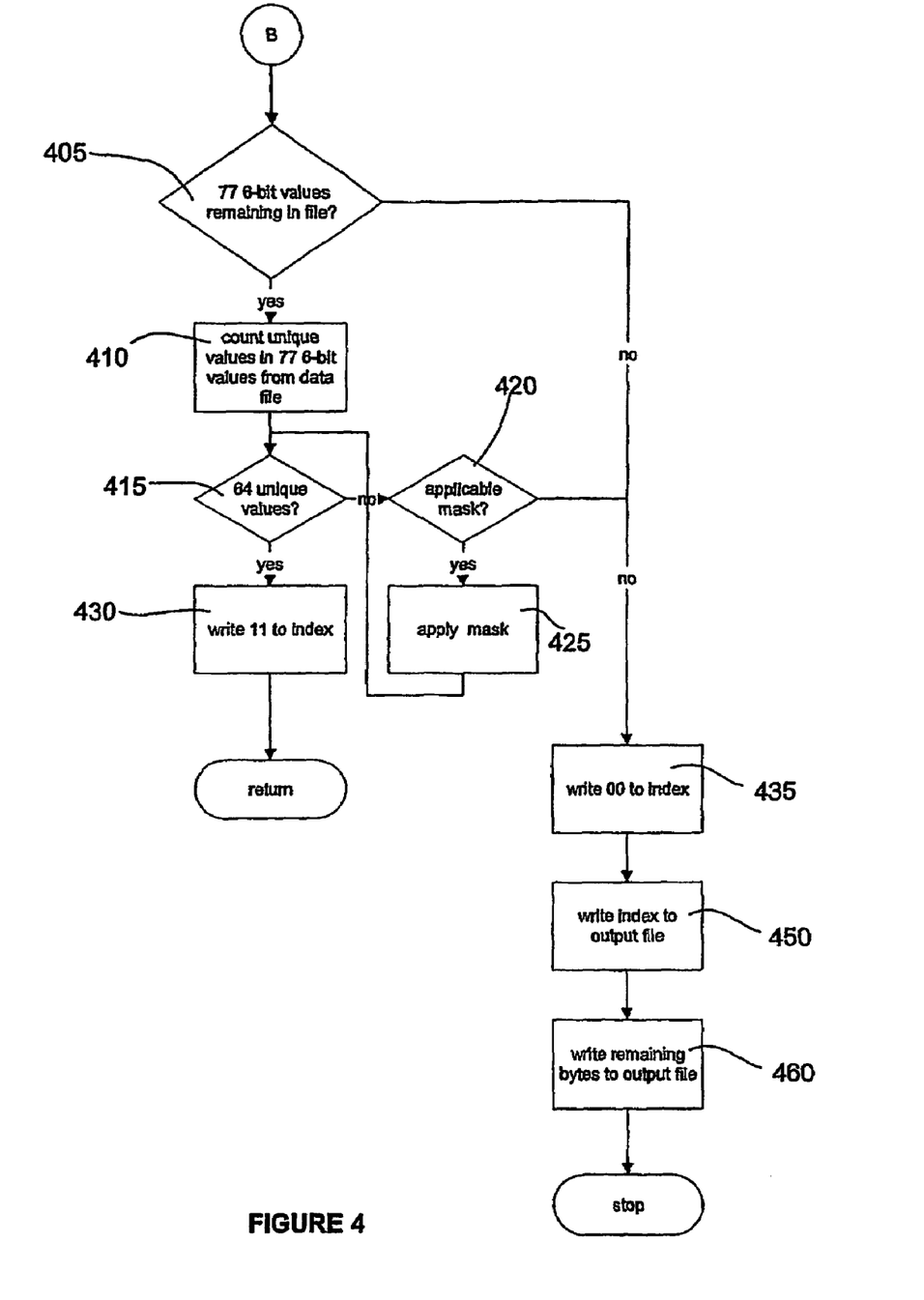

FIGS. 2 to 4 illustrate a preferred form operation of the invention. A binary data file 5 is preferably segmented into a plurality of data groups. In one preferred form of the invention, each data group is preferably 300 bytes or less. It will, however, be appreciated that the size of the data group being compressed could be any size over five bits. The data file is first checked 200 to establish whether or not the data file is of a length greater than or equal to a predefined length. In one preferred form of the invention the initial predefined length is 300 bytes. In one form the entire data file could be retrieved from secondary storage and the entire data file stored in data array 90 in direct access memory 25. Alternatively portions of the data file 5 could be retrieved from secondary storage 10 as a data stream.

The data group is counted 205 in order to calculate the frequency of unique data values within the data group. The frequency of unique data values is compared 210 with a predefined threshold. In one preferred form the predefined threshold is 256. If there are less than 256 unique values within the 300 byte sub-sequence, then one or more data transformations could be applied to the sub-sequence in an attempt to increase the frequency of unique byte values within the sub-sequence.

If the frequency of unique byte values falls below the predefined threshold of 256 values within 300 bytes then the sub-sequence is tested 215 to identify whether or not a data transformation "mask" is applicable to the sub-sequence. In one preferred form of the invention, a structure library is maintained in computer memory for example direct access memory 25. The library preferably includes a plurality of randomly generated data sets. These data sets could be each identified by a data set identifier, the data set identifiers stored in computer memory and associated with respective randomly generated data sets.

In one form at least one of the randomly generated data sets has a length substantially equal to the length of the sub-sequence of the data file. In other words the number of bytes in the sub-sequence is the same as the number of bytes in the transformation data set or mask. Such a mask could be applied to the sub-sequence by applying a data transformation to respective byte values in the sub-sequence based on corresponding byte values and the retrieved transformation data set.

One example of a data transformation is modulus addition. The first byte value of the sub-sequence and the first byte value of the data set are added together and the modulus 256 of the total is then calculated. For example, if the first binary value of the sub-sequence is 168 and the first binary value of the data set identified is 203 then the combined total is 371. The transformed value is 115, calculated by 371 MOD 256. The second byte in the sequence is then transformed in the same way by the second byte in the data set. The third byte in the sub-sequence is then transformed based on the third byte in the data set and so on.

In this way the mask is applied 220 to the sub-sequence.

In one form, there could be 65,536 mask structures stored in computer memory, each mask provided with a data set identifier in the form of an index number between 0 and 65,536. The index could be simply a 14 bit segment pointing to the relevant data set identifier.

The data transformation components 40 could include mask formulae for example:

Standard deviation of preceding sequences of the data file of 300 bytes or less. It will be appreciated that this formulae is not available for use on the first sequence of a data file as there is at that time no preceding sub-sequence.

Reversal of values within the sub-sequence based on previous sub-sequences or standard deviations.

Calculated applicable structures based on the structure of the sub-sequence.

Randomly generated segments based on file structure, added or subtracted to the relevant sub-sequence.

The above formulae could be applied in advance to generate a series of mask structures. Alternatively the relevant byte values could be calculated during a data transformation. In one form 512 randomly generated structures or mask structures are stored in direct access memory 25. These structures are applied to sub-sequences of data files that may have 256 or more null values within a 300 byte sequence. This is common in the headers forming part of the binary files of many software applications. These randomly generated structures can also be applied to other formats that have high levels of repetition.

Following the data transformation on the sub-sequence, the sub-sequence is again tested 210 to identify whether or not there are 256 unique values within the 300 byte sequence. If there are not 256 unique values, and no further mask is applicable to the sub-sequence, then the threshold of 300 bytes is lowered and the process repeated on a smaller sub-sequence. In one preferred embodiment the threshold could be lowered temporarily to 152 7 bit values or 77 6 bit values to examine fewer than 300 8 bit values (bytes). The threshold would then be raised to 300 bytes for the next sub-sequence. This will be described in more detail below.

It is unlikely that addition of a random file will create 256 unique values within a 256 byte segment but it is possible in about 10% of cases, It is anticipated that there will be 256 unique values within a data segment not exceeding 300 bytes once the appropriate random file structure has been applied. In any case, the intention of the data transformation is to increase the frequency of unique data values in the data group.

The invention calculates an index of the 300 data values within the data group.

The index is preferably stored in the data array 90 in direct access memory 25. The index of the 300 data values is first created with two bits. If 256 unique values have been identified within the 300 byte data group, then the bit values "01" are written 225 to the index.

Where a mask has been applied to the sub-sequence, the mask or data set identifier is then written 230 to the index This mask identifier will preferably be a 16 bit value identifying the mask value between 0 and 65,536. The value 0 in the mask identifier represents the fact that no mask, or a null mask, has been applied to the sub-sequence. Where a null data set is applied to a sub-sequence, the sub-sequence following data transformation is substantially identical to the sub-sequence prior to the data transformation.

The next step in the method of the invention is to create 235 a temporary position index.

The temporary position index creating method starts at the first byte in the data group and examines subsequent bytes in the data group until 256 unique values have been identified, in the case where 256 unique values are being extracted from a 300 byte data group. If a particular value being examined is the first occurrence of the data value in the data group, or a previous data group, a "1" bit value is added to the temporary index. On the other hand, if the data value being examined is a repeat of an earlier data value, then a "0" bit value is written into the index. The indexing method terminates as soon as 256 "1" bits have been written to the index.

The temporary index facilitates easy placement and identification of each data. value in the data group in the resulting compressed bit stream. The number of "1" values in the index indicates how many bit values are used. For example, if 256 "1" values occur in the temporary index after 283 entries in the temporary index, this indicates that there are 256 unique byte values within 283 bytes of the sub-sequence.

The first two bits of the index will have already been set to "01" if there are 256 or more values within the 300 byte data group. While the temporary index could simply be added to the main index, there is a more efficient way of storing this information. The number of "1" values that appears in the sub-sequence is already known. If the order in which they appear is disregarded, it is only necessary to record the number of instances of unique byte values.

Rather than record the temporary index itself it is preferable to create 240 a position index and write this position index to the main index. Where the temporary index includes 256 "1" values followed by 44 "0" values for a 300 byte subsequence, this could be assigned the position index "0". The number of ways in which 44 "0" values and 256 "1" values can be arranged within the 300 byte data group is $^nC_r$. This means that there are 300!/256!.44! possible combinations equal to $1.34 \times 10^{53}$ within 300 values where there are 256 "1" values and 44 "0" values.

This maximum position index value of $1.34 \times 10^{53}$ is less than the value $2^{177}$, a value that requires 177 bits in order to be represented.

This means that rather than storing the actual temporary index of 300 bits, by taking advantage of the fact that there are at least 256 "1" values in the temporary index, the position index instead can be recorded in 177 bits, or 22.125 bytes.

It is also important to record the order of the data values within the data group to enable not only compression but also decompression. This is achieved by creating 245 a permutation index and by writing this permutation index to the main index The permutation index calculation is based on the number of ways 256 unique values can be ordered, or the permutations of 256 values without repetition. For the first value there are 256 possibilities, for the second there are 255, for the third there are 254 and so on. This is represented as 256!, referred to as "256 factorial". The number of possible permutations of 256 unique values is therefore $8.57 \times 10^{506}$. This value can be represented by 1,684 bits as $2^{1684}$ is equal to $8.6 \times 10^{506}$ which is greater than $8.57 \times 10^{506}$. 1,684 bits is equivalent to 210.5 bytes.

The sequence 0, 1, 2, 3, 4 . . . , 254, 255 would be represented as permutation number 1 and the sequence 255, 254, 253 . . . 3, 2, 1, 0 would be represented by permutation number $8.57 \times 10^{506}$ The permutation index is written to the main index. The main index will by now include a data value representing the calculated frequency of unique bit values within the sub-sequence. This will be the bit values "01", followed by 16 bits representing the mask that has been applied, followed by 177 bits representing the position index, followed by 1,684 bits representing the permutation index.

Upon reaching a point where there are either not enough bits left in the data file to obtain a sub-sequence of a sufficient length, or there are not enough unique values left, then the index is written 250 to the output file.

The output file preferably includes three initial bytes to identify the file type. A further two bytes following the file type identifier indicate the number of times the method of the invention has been run across a particular data file to a maximum of 65,536 iterations.

Following these five bytes, the index stored in the data array 90 is added to the output file. Following the index are added any values outstanding from the indices or due to a lack of sufficient bit values remaining in the data file or unique values.

In most cases, it is expected that there will be the five header bytes followed by the body and 63 or less bit values written in full in an uncompressed form at the end of the output file. The body of the output file is preferably a collection of indices that are written consecutively to facilitate extraction in a streaming manner.

As described above in FIG. 2, there will be instances where there are no longer 300 bytes remaining in a data file following multiple iterations of the method of the invention, or there will be a sub-sequence of 300 bytes in which there are not 256 unique values and no further mask is applicable. As indicated at 260, in one preferred form the size of the sub-sequence retrieved from the data file can be reduced Referring to FIG. 3, the data file is checked 305 to identify whether there are at least 152 bytes remaining the data file.

If there are at least 133 bytes which comprises 152 7 bit values remaining in the data file, then the number of unique values within the 152 7 bit values is counted 310. The number of unique values is then checked 315 against a threshold number of for example 128. If there are not sufficient unique values in the 133 byte sub-sequence, then an applicable mask is identified 340 and applied 345 in a similar manner to steps 215 and 220 from FIG. 2.

Once the threshold number of unique values have been identified in the 152 7 bit values in the data file, then the bit sequence "10" is written 350 to the index and the method proceeds to the steps indicated at 230 onwards in FIG. 2.

If there are not 152 7 bit values remaining to be processed in the data file, or 128 unique values cannot be located within a 152 7 bit sub-sequence and no further masks are applicable as indicated at 355 then the method passes to that shown in FIG. 4. As shown in FIG. 4, the number of bit groups in the data file under examination is reduced to 77 6 bit values. If there are 77 6 bit values remaining in the data file 405 then the number of unique values in the 77 6 bit values is counted 410.

The number of unique values is checked 415 against a threshold of 64. If there are less than 64 unique values in the 77 6 bit values, then the method establishes whether 420 a mask is applicable. If a mask is applicable the mask is applied 425. These last two steps 420 and 425 are similar to steps 215 and 220 from FIG. 2 and steps 340 and 345 from FIG. 3.

If there are 64 unique values in the 77 6 bit sub-sequence, the value "11" is written 430 to the index. Control then returns to steps 230 onwards in FIG. 2.

If there are not 77 6 bit values remaining to be processed in the data file, or there are not 64 unique values within the 77 6 bit values sequence, then the bit value "00" is written 435 to the index, the index is written 450 to the output file in the same manner as step 250 shown in FIG. 2, and the remaining bytes in the data file are written 460 to the output file.

It will be appreciated that minor changes are needed to the permutation index shown at 245 in FIG. 2, depending on the number of bytes under examination. Where there are 128 unique data values within 152 7 bit groups, the position index would be 152!/128!.24! which is equal to $5.48 \times 10^{27}$. This can be represented by 93 bits as $2^{93} = 9.9 \times 10^{27}$.

Where there are 64 unique values across 77 6 bit groups, the index would be 77!/64!/.13!. This can be represented by 42 bits as $2^{48} = 2.81 \times 10^{14}$ which is greater than the former value being $1.84 \times 10^{14}$.

Similarly, minor changes are required for the permutation index shown at step 245 in FIG. 2 depending on the number of bytes under examination. The permutations for 128 values is 128! or $3.86 \times 10^{215}$. This requires 717 bits to represent as $2^{717} = 6.89 \times 10^{215}$ The permutations for 64 values is 64! or $1.27 \times 10^{89}$. This can be represented by 296 bits as $2^{296} = 1.27 \times 10^{89}$.

Figure 5:
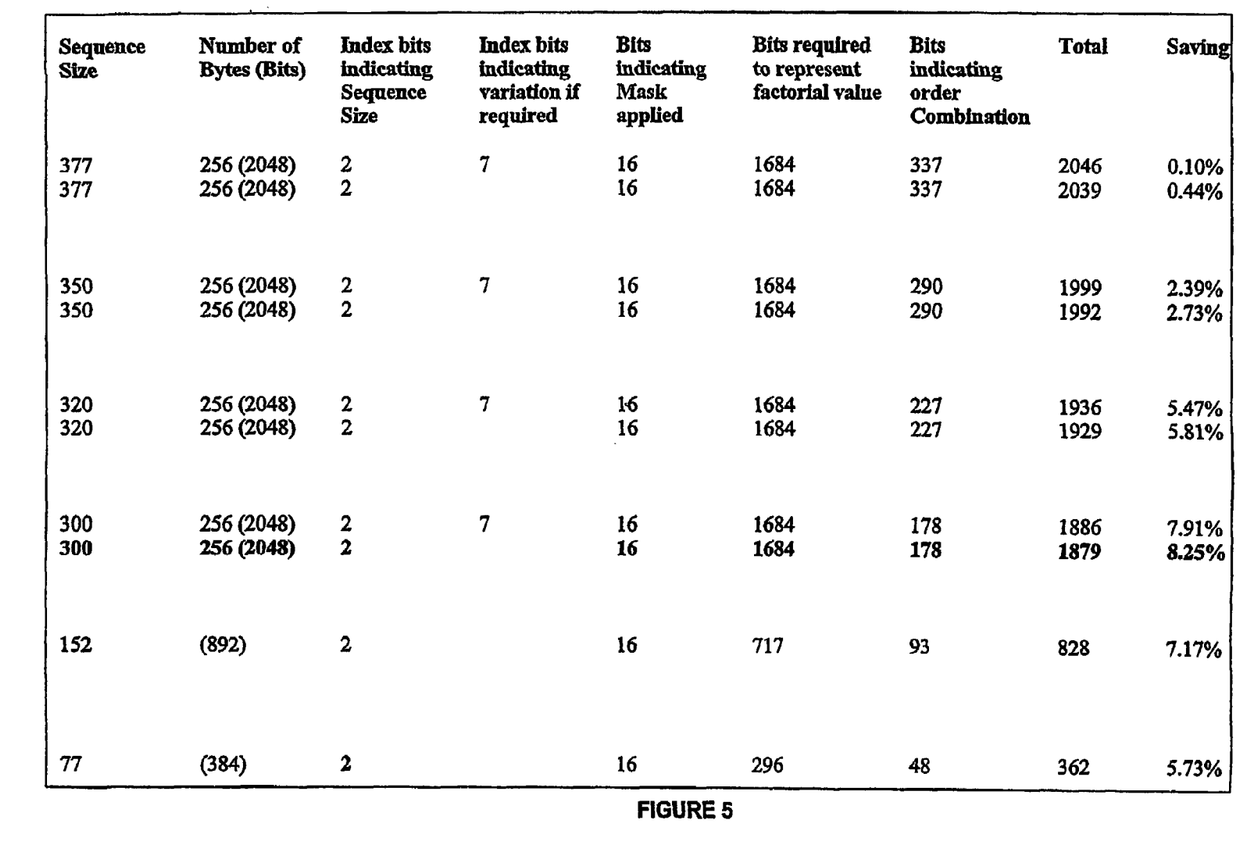
FIG. 5 shows a table of expected compression results for preferred embodiments of the invention.

FIG. 5 illustrates a table of expected results on data group sizes of 377 (8 bit groups) bytes, 350 bytes, 320 bytes, 300 bytes, 152 7 bit groups and 77 6 bit groups. Included in this table is an indication of the effects of the inclusion of a variation. This is described below.

Decompression is a simple matter of reversing the above procedure. The index value indicates the range of each value from the first to the last ($256^{th}$). Having the range provides the relevant value. The index could be used for restructuring in conjunction with the header. As all components are packed together, it is envisaged that streaming be used.

Indexing of the placement of repeated values could be changed from the string of "0" and "1" values for segments in cases where there is a more efficient method. For example, if there are only one or two repeated values, the number of bytes would be 257 or 258. Rather than use the $257^{th}$ and $258^{th}$ bits, it is known that the first and last bytes are unique for that segment. Therefore, in the case of 257 values, 8 bits will provide the location of the single repeated value and 16 bits will provide the location of both repeated values in the case of a 258 byte segment.

The method could be applied to all file types and structures. For file types or structures that are compressed by considerable amounts by tools such as PKWare's ZIP product, the method of the invention on a single pass would not achieve the same levels. However, the method could be applied repeatedly over the same file, reducing it in size each time. The number of times or iterations is dependent on hardware processing and/or user required times.

Decompression is extremely rapid, as all components are known. Decompression may be more rapid than compression, as compression requires the matching of random data structures.

As all indexing is contained within the actual data itself, then multiple decompression routines could be performed concurrently.

Other applications could include software compression, data compression, online gaming between consoles such as Sony Playstation 2, Microsoft X-Box and so on, Voice over IP and/or Video on demand. The invention has application anywhere where data or binary information is stored, transmitted or used in any format The description above is based on 256 unique values within a 300 byte segment of code or smaller. It will be appreciated that this selected size is for illustrative purposes only.

Data groups of 5 bits or more or values between 0 and 31 could be restructured using this method. Reducing the number of randomly generated data sets or overlay files could mean that 3 and 4 bit values could be used as well.

Greater savings can be made using larger bit values than the 8 bit (256 values) described. For example, where 9 bit values are compressed, there is a further gain in compression over that achieved by 8 bit compression.

Savings or compression increases with the number of bits used per value. 256 values (300 byte segments) do not compress as much as 512 values (600 byte segments). In turn, 512 value data does not compress as much as 1024 values. There is no upper determinable level, as calculations must be based on file size.

Using the 300 byte method above, this can be extended to 377 byte groups. This means the effective range is 256 to 377 byte groupings, with 300 bytes being the optimal level for preferred embodiments described in this specification and as illustrated in FIG. 5.

Variations on the 300 8 bit groups (byte), 152 7 bit groups and 77 6 bit groups may be indicated in the header of the compressed file. The variation may consist of two (2) parts. These are:

1. an indication of the number of relevant bit groups per segment size. The range in size for B bit groups is 256 to 377, which may be represented in 7 bits. For 7 bit groups the range may be indicated in 5 bits, and for 6 bit groups the range may be indicated in 4 bits.
2. A further bit may be added at the end of each of the above to indicate if variances occur within each of the bit groups. "0" may indicate No, and "1" may indicate Yes.

The header may. then contain an additional 19 bits indicating the above values.

If a variation value is allowed, as per the header, then on a group by group basis a variation value may be written into the index.

For example, default on a group of 8 bit groups may be 300 values, but each segment may vary between 256 and 377 values, as indicated by the included variation value.

Further embodiments of the invention may involve multi-repetitive byte compression enhancement and this is described with reference to FIGS. 6 and 7.

Functional electronic files fall into a number of different categories of byte structuring. These vary from the simple 2 colour bitmaps through to files compressed using any of the currently available lossless compression algorithms.

For 2 colour bitmaps following the header information one bit value means black, the other white. As there is a lot of repetition, compression of these files in a lossless manner is simple.

Moving to 24 bit bitmaps the identification of patterns becomes more difficult, and hence lossless compression rates are not as great using current algorithms as they are on simpler bitmap structures.

The process described here, introduces simpler patterns to a 24 bit bitmap, which for a standard photo type image allows lossless compression using any of the currently available lossless compression algorithms to significantly increase the amount of compression.

Figure 6:
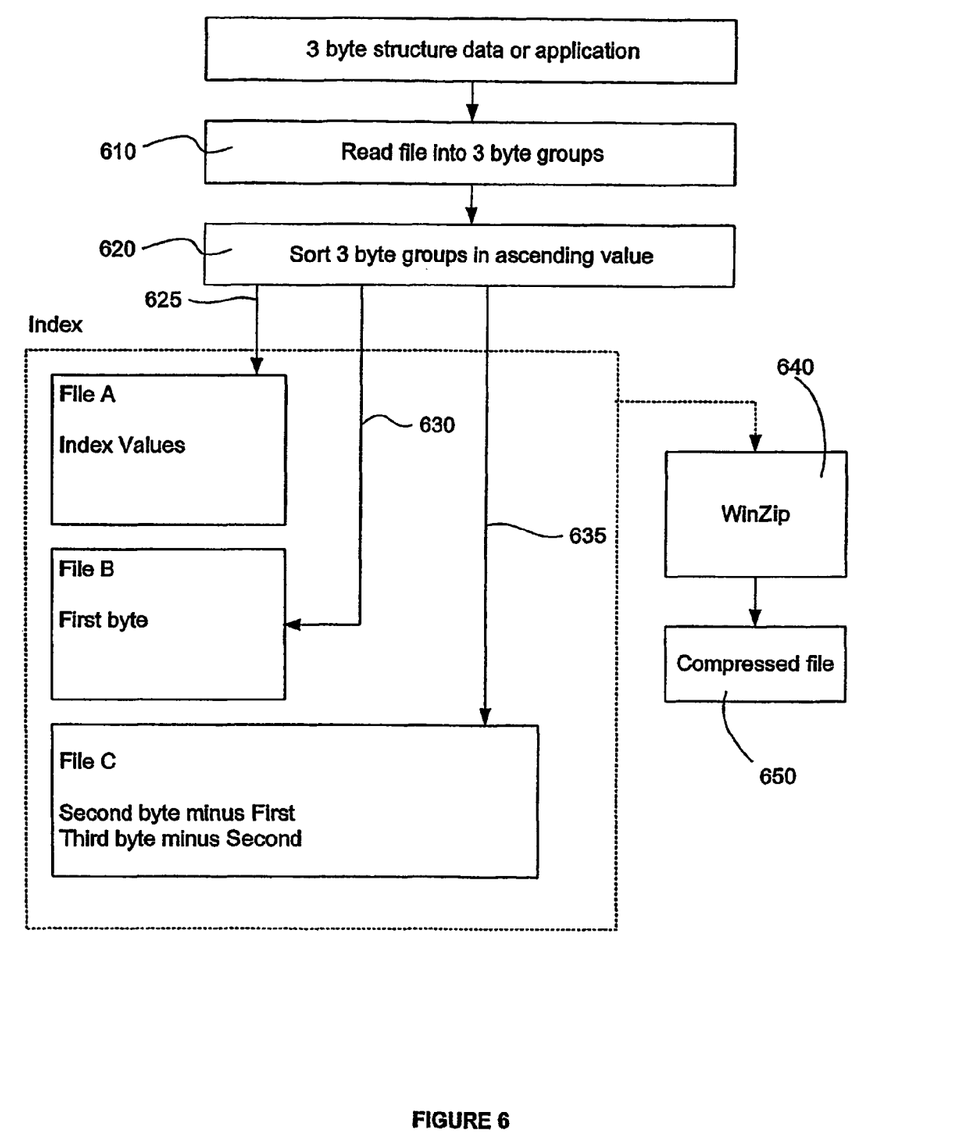
FIG. 6 illustrates a further aspect of the invention related to multi-repetitive byte compression enhancement.
Figure 7:
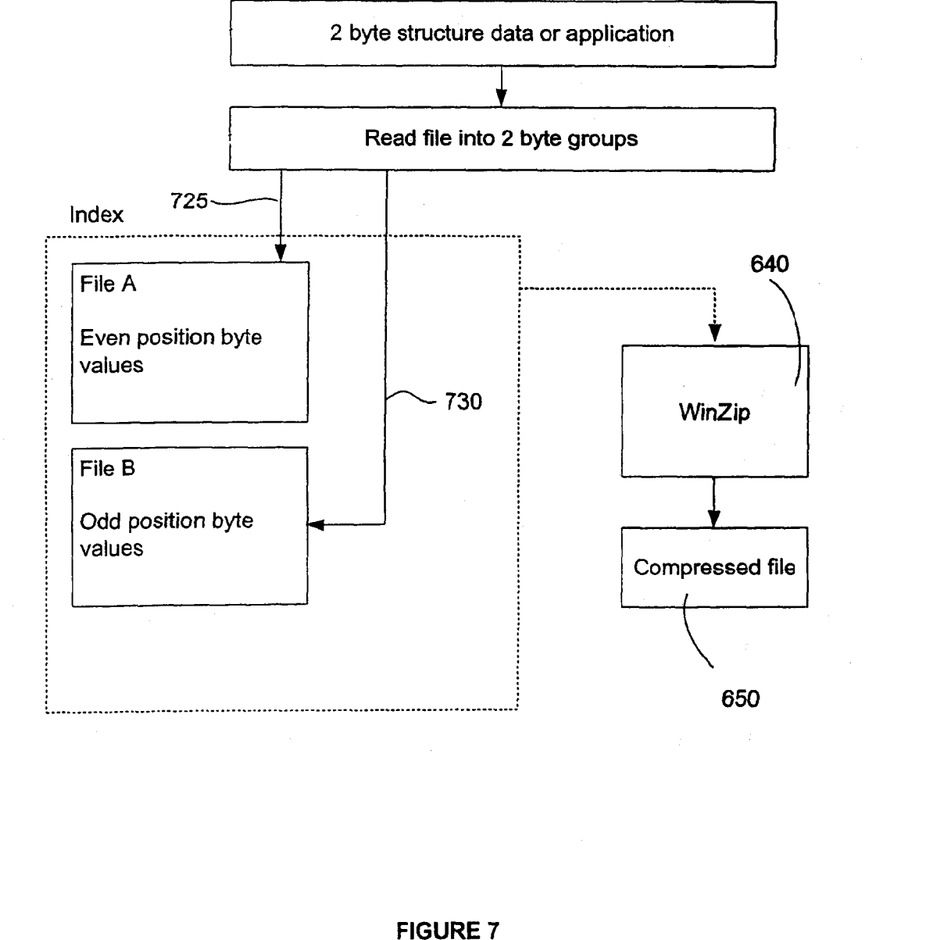
FIG. 7 also illustrates a further aspect of the invention related to multi-repetitive byte compression enhancement.

To achieve this, the original image is broken into 3 components as illustrated at 610 in FIG. 6, the size of which combined is significantly larger than the original image.

All 3 byte (24 bit) groups are then arranged in ascending decimal value order as illustrated at 620. For example 236, 217, 67 are rearranged to 67, 217, 236. The change in arrangement of the bytes is recorded in an index using Huffman structures.

As there are only 6 possible original structures, these are recorded using the following bit indexes:
00=123
01=132
100=213
101=231
110=312
111=321

Each of the above numbers represents the original positions of the bytes when compared to their sorted placement This index is written to a file (File A) once an image has been completely scanned as shown at 625.

All of the lowest, or now first byte values from each group are then written into a separate file (File B) as illustrated at 630.

As the byte values are in order, the value of the second byte value minus the first is written into a file (File C) immediately followed by the value of the third byte minus the second byte value as shown at 635.

This has created 3 files File A, File B and File C. The combined total of File B and File C will be the same as the original 24 bit bitmap. File A is an extra overhead in size as it represents the indexing of the bytes.

If all three files (A, B and C) are then compressed into one file 650 using a lossless algorithm or product like WINZIP 640, then the resultant file is on average 25% smaller than that achieved by simply applying these tools across the un-modified image file.

Testing has indicated a worst case scenario of a 2.5% drop, and best case has been 82% of picture quality true 24 bit bitmaps. The same gains can be made using the lossless compression mode of JPEG.

This process can be applied to any file structure using 3 byte grouping to retain data. It may also be expanded to cover 4, 5, 6, 7, 8 etc byte structures to achieve greater levels of lossless compression.

As Bitmap files are used to display images, Wave (.wav) files are used to play sound. A further example of the compression enhancement process will now be described in relation to Wave format files with reference to FIG. 7. As there are differing levels of Bitmap files (2 bit, 4bit, 8 bit, 10 bit, 12bit, 16 bit, 24bit and 30 bit) each offering more colours or quality, the same occurs for Wave files.

Wave files are created using a number of components, these are the Average sampling rate, Sample rate, Audio sample size and the number of Channels.

Lower sampling rates mean a smaller file, but with less quality. A mono file is also smaller than a stereo file.

The Wave format being addressed here, is the format used when storing full quality stereo music on a commercial CD. This format is converted from a Wave format to the CD format For a Wave file with an Average data rate of 176.4 Kb/second, a Sample rate of 44.1 kHz, an Audio sample size of 16 bit and 2(Stereo) Channels, the following may be applied.

If all byte values in the file are represented as being numbered 1 to n where n is the last byte in the file (for a normal audio file this will be in the order of 50,000,000), all even position byte values are written to one file (File A), as shown at 725 with all odd position byte values written to a separate file (File B), as shown at 730. For example:

| Byte Values | 255 | 167 | 33 | 0 | 0 | 24 | 24 | 167 | 167 |
|---|---|---|---|---|---|---|---|---|---|
| Order Value | 1 | 2 | 3 | 4 | 5 | 6 | 7 | 8 | 9 |
| File 1 (odd) | 255 | | 33 | | 0 | | 24 | | 167 |
| File 2 (even) | | 167 | | 0 | | 24 | | 167 | |

If both files (File 1 and File 2) are then compressed into one file using a lossless algorithm or product like WINZIP, once again shown at 640, then the resultant file, 650, is on average 20% smaller, than that achieved by simply applying these tools across the unmodified image file.

Testing has suggested a worst case scenario of a 10% additional drop in the size of the compressed file, the best case has been a 43% drop in size.

Extraction/Decompression is simple, the bytes from File 2, are re-inserted between each of the bytes in File 1 after the two files have been decompressed using the relevant lossless tool.

The foregoing describes the invention including preferred forms thereof. Alterations and modifications as will be obvious to those skilled in the art are intended to be incorporated within the scope hereof, as defined by the accompanying claims.

What is claimed:

1. A method of compressing a data file comprising a sequence of bytes of a length greater than or equal to a predefined length, the method including the steps of:
   retrieving the data file from a secondary storage device;
   storing the data file in direct access memory;
   calculating the frequency of unique byte values within a sub-sequence of the data file, the sub-sequence having a length not exceeding the predefined length;
   creating an index for the sub-sequence, the index including a data value representing the calculated frequency of unique byte values within the sub-sequence; and
   on the sub-sequence having a frequency of unique byte values below a predetermined threshold, applying a data transformation to the sub-sequence to increase the frequency of unique byte values in the sub-sequence and adding to the index a data value representing the data transformation;
   on the sub-sequence having a frequency of unique byte values above a predefined threshold, adding to the index a data value representing the position of one or more unique values within the sub-sequence;
   creating an output data file, the data file having a file type identifier; and
   adding the index to the output data file.

2. A method of compressing a data file as claimed in claim 1 wherein the step of applying a data transformation to the sub-sequence further includes the steps of:
   maintaining in computer memory a plurality of transformation data sets, the data sets having a sequence of byte values and identified by a transformation data set identifier;
   retrieving one of the transformation data sets from computer memory, the retrieved transformation data set having a length substantially equal to the length of the sub-sequence of the data file; and applying a data transformation to respective byte values in the sub-sequence based on corresponding byte values in the retrieved data set.

3. A method of compressing a data file as claimed in claim 2 wherein the sub-sequence following data transformation based on at least one of the retrieved transformation data set is substantially identical to the sub-sequence prior to the data transformation.

4. A method of compressing a data file as claimed in claim 2 wherein at least one of the transformation data sets comprises a randomly generated sequence of byte rates.

5. A method of compressing a data file as claimed in claim 2 wherein at least one of the transformation data sets comprises a predefined sequence of byte rates.

6. A method of compressing a data file as claimed in claim 2 wherein at least one of the transformation data sets comprises a sequence of byte values derived from a portion of the data file other than the sub-sequence of the data file.

7. A method of compressing a data file as claimed in claim 2 further comprising the step of adding to the index the transformation data set identifier of the data transformation data set applied to the sub-sequence.

8. A method of compressing a data file comprising a sequence of bytes of a length greater than or equal to a predefined length, the method including the steps of:
  retrieving the data file from a secondary storage device;
  storing the data file in direct access memory;
  calculating the frequency of unique byte values within a sub-sequence of the data file, the sub-sequence having a length not exceeding the predefined length;
  calculating the position of the one or more unique values within the sub-sequence;
  creating an index for the sub-sequence, the index including a data value representing the calculated frequency of unique byte values within the sub-sequence; and
  on the sub-sequence having a frequency of unique byte values below a predetermined threshold, applying a data transformation to the sub-sequence to increase the frequency of unique byte values in the sub-sequence and adding to the index a data value representing the data transformation;
  on the sub-sequence having a frequency of unique byte values above a predefined threshold, adding to the index a data value representing the position of one or more unique values within the sub-sequence;
  creating an output data file, the data file having a file type identifier; and
  adding the index to the output data file.

9. A method of compressing a data file as claimed in claim 8 wherein the step of calculating the position of the one or more unique values within the sub-sequence further comprises the steps of:
  creating a temporary position index in computer memory;
  retrieving successive byte values from the sub-sequence;
  on retrieving each byte value, determining whether the retrieved byte value is a unique byte value or a repeated value;
  on detection of a unique byte value, adding one of two bit values to the temporary position index otherwise adding the other of the two bit values to the temporary position index;
  creating a position index representing the position of the one or more unique values from the temporary position index; and
  calculating the data value representing the position of the one or more unique values at least partly from the position index.

10. A method of compressing a data file as claimed in claim 9 wherein the number of bytes in the sub-sequence is substantially equal to the number of bits in the temporary position index.

11. A method of compressing a data file as claimed in claim 9 wherein the size of the position index is less than the size of the temporary position index.

12. A method of compressing a data file as claimed in claim 9 further comprising the steps of:
  creating a permutation index representing the order of unique byte values within the sub-sequence; and
  calculating the data value representing the position of the one or more unique values both from the position index and the permutation index.

13. A method of compressing a data file as claimed in claim 12 comprising the step of concatenating the position index and the permutation index to form the data value representing the position of the one or more unique values.

14. A system for compressing a data file comprising a sequence of bytes of a length greater than or equal to a predefined length, where the system is configured to:
  retrieve the data file from a secondary storage device;
  store the data file in direct access memory;
  calculate the frequency of unique byte values within a sub-sequence of the data file, the sub-sequence having a length not exceeding the predefined length;
  create an index for the sub-sequence, the index including a data value representing the calculated frequency of unique byte values within the sub-sequence; and
  on the sub-sequence having a frequency of unique byte values below a predetermined threshold, apply a data transformation to the sub-sequence to increase the frequency of unique byte values in the sub-sequence and add to the index a data value representing the data transformation;
  on the sub-sequence having a frequency of unique byte values above a predefined threshold, add to the index a data value representing the position of one or more unique values within the sub-sequence;
  create an output data file, the data file having a file type identifier; and
  add the index to the output data file.

15. A system for compressing a data file comprising a sequence of bytes of a length greater than or equal to a predefined length, where the system is configured to:
  retrieve the data file from a secondary storage device;
  store the data file in direct access memory;
  calculate the frequency of unique byte values within a sub-sequence of the data file, the sub-sequence having a length not exceeding the predefined length; and
  calculate the position of the one or more unique values within the sub-sequence;
  create an index for the sub-sequence, the index including a data value representing the calculated frequency of unique byte values within the sub-sequence; and
  on the sub-sequence having a frequency of unique byte values below a predetermined threshold, apply a data transformation to the sub-sequence to increase the frequency of unique byte values in the sub-sequence and add to the index a data value representing the data transformation;
  on the sub-sequence having a frequency of unique byte values above a predefined threshold, add to the index a data value representing the position of one or more unique values within the sub-sequence;
  create an output data file, the data file having a file type identifier; and add the index to the output data file.

16. A computer program stored on tangible storage medium comprising executable instructions for performing a method of compressing a data file comprising a sequence of bytes of a length greater than or equal to a predefined length, the method comprising:
- retrieving the data file from a secondary storage device;
- storing the data file in direct access memory;
- calculating the frequency of unique byte values within a sub-sequence of the data file, the sub-sequence having a length not exceeding the predefined length;
- creating an index for the sub-sequence, the index including a data value representing the calculated frequency of unique byte values within the sub-sequence; and
- on the sub-sequence having a frequency of unique byte values below a predetermined threshold, applying a data transformation to the sub-sequence to increase the frequency of unique byte values in the sub-sequence and adding to the index a data value representing the data transformation;
- on the sub-sequence having a frequency of unique byte values above a predefined threshold, adding to the index a data value representing the position of one or more unique values within the sub-sequence;
- creating an output data file, the data file having a file type identifier; and
- adding the index to the output data file.

17. A computer program stored on tangible storage medium comprising executable instructions for performing a method of compressing a data file comprising a sequence of bytes of a length greater than or equal to a predefined length, the method comprising:
- retrieving the data file from a secondary storage device;
- storing the data file in direct access memory;
- calculating the frequency of unique byte values within a sub-sequence of the data file, the sub-sequence having a length not exceeding the predefined length; and
- calculating the position of the one or more unique values within the sub-sequence;
- creating an index for the sub-sequence, the index including a data value representing the calculated frequency of unique byte values within the sub-sequence; and
- on the sub-sequence having a frequency of unique byte values below a predetermined threshold, applying a data transformation to the sub-sequence to increase the frequency of unique byte values in the sub-sequence and adding to the index a data value representing the data transformation;
- on the sub-sequence having a frequency of unique byte values above a predefined threshold, adding to the index a data value representing the position of one or more unique values within the sub-sequence;
- creating an output data file, the data file having a file type identifier; and
- adding the index to the output data file.

* * * * *